US011869609B2

(12) United States Patent
Chu

(10) Patent No.: US 11,869,609 B2
(45) Date of Patent: Jan. 9, 2024

(54) METHOD AND APPARATUS FOR TESTING MEMORY, MEDIUM AND DEVICE

(71) Applicant: CHANGXIN MEMORY TECHNOLOGIES, INC., Hefei (CN)

(72) Inventor: Xikun Chu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/846,009

(22) Filed: Jun. 22, 2022

(65) Prior Publication Data

US 2023/0326539 A1 Oct. 12, 2023

Related U.S. Application Data

(63) Continuation of application No. PCT/CN2022/089105, filed on Apr. 25, 2022.

(30) Foreign Application Priority Data

Mar. 23, 2022 (CN) .......................... 202210293283.8

(51) Int. Cl.
*G11C 29/02* (2006.01)
*G11C 29/54* (2006.01)

(52) U.S. Cl.
CPC ............ *G11C 29/021* (2013.01); *G11C 29/54* (2013.01)

(58) Field of Classification Search
CPC .............................. G11C 29/021; G11C 29/54
(Continued)

(56) References Cited

U.S. PATENT DOCUMENTS 6,023,434 A * 2/2000 Shore ..................... G11C 29/34
365/201
6,041,002 A * 3/2000 Maejima ................ G11C 29/50
365/201
(Continued)

FOREIGN PATENT DOCUMENTS

CN 101136253 A 3/2008
CN 101162606 A 4/2008
(Continued)

OTHER PUBLICATIONS

United Stated Patent and trademark office, Non-final office action issued in related U.S. Appl. No. 17/807,760 dated Mar. 15, 2023.

*Primary Examiner* — James C Kerveros
(74) *Attorney, Agent, or Firm* — Kilpatrick Townsend & Stockton LLP

(57) ABSTRACT

Provided are a method for testing a memory, an apparatus for testing a memory, a computer-readable storage medium, and an electronic device, which relate to the field of integrated circuit technology. The method for testing a memory includes: writing first data into each of memory cells of a memory array; enabling a data mask mode, and writing second data into each of the memory cells of the memory array; enabling a leakage mode, and writing the first data into a memory cell corresponding to a column under test of the memory array; and after preset leakage time, disabling the leakage mode, and reading data from the memory cell corresponding to the column under test for testing, to determine whether there are at least two columns simultaneously turned on in the memory array. This method may test whether a row decoder fails.

18 Claims, 7 Drawing Sheets

(58) Field of Classification Search
USPC .......................................................... 714/734
See application file for complete search history.

(56) References Cited

U.S. PATENT DOCUMENTS

| | | | |
|---|---|---|---|
| 2002/0080677 A1 | 6/2002 | Watanabe et al. | |
| 2006/0083070 A1* | 4/2006 | Arakawa | G11C 29/021 365/185.21 |
| 2006/0133166 A1 | 6/2006 | Kikutake et al. | |
| 2007/0159900 A1 | 7/2007 | Aoki | |
| 2008/0019199 A1* | 1/2008 | Uchikoba | G11C 29/50016 365/201 |
| 2010/0302866 A1* | 12/2010 | Cha | G11C 29/02 365/201 |
| 2011/0121294 A1* | 5/2011 | Koyama | G01R 31/2644 257/E23.01 |
| 2019/0066770 A1 | 2/2019 | Sisodia et al. | |
| 2020/0176053 A1* | 6/2020 | Lin | G11C 11/419 |
| 2022/0308788 A1 | 9/2022 | Zhao et al. | |
| 2022/0319577 A1 | 10/2022 | Chen et al. | |
| 2023/0008272 A1* | 1/2023 | Rana | G11C 29/4401 |

FOREIGN PATENT DOCUMENTS

| | | |
|---|---|---|
| CN | 100444287 C | 12/2008 |
| CN | 110675904 A | 1/2020 |
| CN | 107039084 B | 4/2020 |
| CN | 112053713 A | 12/2020 |
| CN | 112099734 A | 12/2020 |
| CN | 112885401 A | 6/2021 |
| CN | 114187956 A | 3/2022 |

\* cited by examiner

```
         Row
      ┌─ ─ ─ ─ ▶
   ┌  │ 1 1 1 1
C  │  │ 1 1 1 1
o  │  │ 1 1 1 1
l  │  │ 1 1 1 1
u  │  │ 1 1 1 1
m  ▼  │ 1 1 1 1
n     │ 1 1 1 1
      │ 1 1 1 1
```

Fig. 6

```
         Row
      ┌─ ─ ─ ─ ▶
   ┌  │ 1 1 1 1
C  │  │ 0 0 0 0
o  │  │ 0 0 0 0
l  │  │ 0 0 0 0
u  ▼  │ 0 0 0 0
m     │ 0 0 0 0
n     │ 0 0 0 0
      │ 0 0 0 0
```

Fig. 7

```
         Row
      ┌─ ─ ─ ─ ▶
   ┌  │ 1 1 1 1
C  │  │ 0 1 0 0
o  │  │ 0 1 0 0
l  ▼  │ 0 1 0 0
u     │ 0 1 0 0
m     │ 0 1 0 0
n     │ 0 1 0 0
      │ 0 1 0 0
           ⌄
   Simultaneously turned on
```

Fig. 8

METHOD AND APPARATUS FOR TESTING MEMORY, MEDIUM AND DEVICE

CROSS-REFERENCE TO RELATED APPLICATION

The present disclosure is a continuation of PCT/CN2022/089105, filed on Apr. 25, 2022, which claims priority to Chinese Patent Application No. 202210293283.8, titled "METHOD AND APPARATUS FOR TESTING MEMORY, MEDIUM AND DEVICE" and filed on Mar. 23, 2022, the entire contents of which are incorporated herein by reference.

TECHNICAL FIELD

The present disclosure relates to the field of integrated circuit technology, and more particularly, to a method for testing a memory, an apparatus for testing a memory, a computer-readable storage medium, and an electronic device.

BACKGROUND

As a semiconductor memory device commonly used in computers, Dynamic Random Access Memory (DRAM) has been widely used in the computer field and the electronics industry due to its simple structure, high density, low power consumption, and low price, etc.

For the DRAM, memory cells therein may be selected by means of a row decoder, to perform a read operation, a verification operation or a programming operation on the selected memory cells. Therefore, effectiveness of the row decoder is a prerequisite for performing the above operations on the memory cells.

Failure testing the row decoder is an important type of test in memory testing.

SUMMARY

According to a first aspect of the present disclosure, there is provided a method for testing a memory, and the method includes: writing first data into each of memory cells of a memory array; enabling a data mask mode, and writing second data into each of the memory cells of the memory array; enabling a leakage mode, and writing the first data into a memory cell corresponding to a column under test of the memory array; and after preset leakage time, disabling the leakage mode, and reading data from the memory cell corresponding to the column under test for testing, to determine whether there are at least two columns simultaneously turned on in the memory array.

In an exemplary embodiment of the present disclosure, the reading data from the memory cell corresponding to the column under test for testing includes: testing the data read from the memory cell corresponding to the column under test by means of a preset test mode, to obtain a test result.

In an exemplary embodiment of the present disclosure, the preset test mode is an exclusive-OR mode.

In an exemplary embodiment of the present disclosure, the testing the data by means of a preset test mode to obtain the test result includes: inputting the data from the memory cell corresponding to the column under test into the preset test mode; in the preset test mode, performing an exclusive-OR operation on the data of the column under test pairwise to obtain a plurality of operation results; and performing an OR operation on the plurality of operation results to obtain the test result.

In an exemplary embodiment of the present disclosure, the method further includes: when the test result is a high level, determining that there are at least two columns simultaneously turned on in the memory cell.

In an exemplary embodiment of the present disclosure, when determining that there are at least two columns simultaneously turned on in the memory array, it is determined that a row decoder of the memory is abnormal.

In an exemplary embodiment of the present disclosure, the leakage mode is a floating-point test mode.

In an exemplary embodiment of the present disclosure, the first data is 1, and the second data is 0.

In an exemplary embodiment of the present disclosure, the preset leakage time is time from an activation command to a precharge command.

According to a second aspect of the present disclosure, there is provided an apparatus for testing a memory, the apparatus including: a first-data writing circuit, a second-data writing circuit, a leakage circuit, and a test circuit. The first-data writing circuit is configured to write first data into each of memory cells of a memory array. The second-data writing circuit is configured to enable a data mask mode, and write second data into each of the memory cells of the memory array. The leakage circuit is configured to enable a leakage mode, and write the first data into a memory cell corresponding to a column under test of the memory array. The test circuit is configured to disable, after preset leakage time, the leakage mode, and read data from the memory cell corresponding to the column under test for testing, to determine whether there are at least two columns simultaneously turned on in the memory array.

In an exemplary embodiment of the present disclosure, the test circuit is configured to test the data read from the memory cell corresponding to the column under test by means of a preset test mode, to obtain a test result.

In an exemplary embodiment of the present disclosure, the preset test mode is an exclusive-OR mode.

In an exemplary embodiment of the present disclosure, the test circuit is configured to: input the data from the memory cell corresponding to the column under test into the preset test mode; perform an exclusive-OR operation on the data of the column under test pairwise in the preset test mode to obtain a plurality of operation results; and perform an OR operation on the plurality of operation results to obtain the test result.

In an exemplary embodiment of the present disclosure, the test circuit is configured to determine, when the test result is a high level, that there are at least two columns simultaneously turned on in the memory cell.

In an exemplary embodiment of the present disclosure, the test circuit is configured to determine, when determining that there are at least two columns simultaneously turned on in the memory array, that a row decoder of the memory is abnormal.

In an exemplary embodiment of the present disclosure, the leakage mode is a floating-point test mode.

In an exemplary embodiment of the present disclosure, the first data is 1, and the second data is 0.

In an exemplary embodiment of the present disclosure, the preset leakage time is time from an activation command to a precharge command.

According to a third aspect of the present disclosure, there is provided a computer-readable storage medium storing a computer program thereon, the computer program is executable by a processor, whereby the method for testing a memory is implemented.

According to a fourth aspect of the present disclosure, there is provided an electronic device, which includes a processor and a memory configured to store executable instructions of the processor. The processor is configured to perform the method for testing a memory by executing the executable instructions.

BRIEF DESCRIPTION OF THE DRAWINGS

FIGS. 6 to 9 schematically show a schematic diagram I of a data distribution structure of a memory array according to an exemplary embodiment of the present disclosure;

DETAILED DESCRIPTION

Figure 1:
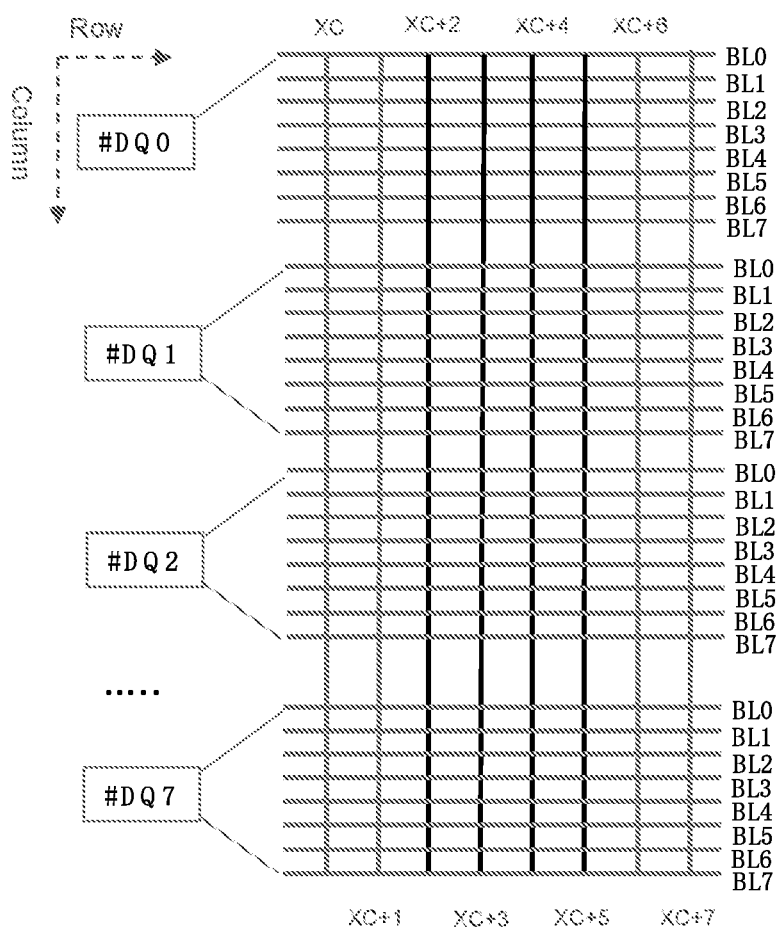
FIG. 1 schematically shows a schematic structural diagram of a memory array according to an exemplary embodiment of the present disclosure.

Exemplary embodiments will now be described more comprehensively with reference to the accompanying drawings. However, the exemplary embodiments can be embodied in many forms and should not be construed as limited to the embodiments set forth herein; rather, these embodiments are provided such that the present disclosure will be made thorough and complete, and the concept of exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

In addition, the accompanying drawings are merely exemplary illustration of the present disclosure, and are not necessarily drawn to scale. The same reference numerals in the drawings denote the same or similar parts, and thus repeated description thereof will be omitted. Some block diagrams shown in the figures are functional entities and not necessarily to be corresponding to a physically or logically individual entities. These functional entities may be implemented in software form, or implemented in one or more hardware circuits or integrated circuits, or implemented in different networks and/or processor apparatuses and/or microcontroller apparatuses.

The flowcharts as shown in the accompanying drawings are merely exemplary description instead of necessarily including all the steps. For example, some steps may be broken down, while some steps may be combined or partly combined. Therefore, the actual execution sequences may be changed according to the actual conditions. In addition, all the following terms "first", "second" and "third" are for the purpose of distinction only, and should not be used as a limitation on contents of the present disclosure.

A semiconductor memory is used in computers, servers, handheld devices such as mobile phones, printers, and many other electronic devices and applications. The semiconductor memory includes a plurality of memory cells in a memory array, each of the plurality of memory cell storing at least one bit of information. Dynamic Random Access Memory (DRAM) is an example of such a semiconductor memory. This solution is used in the DRAM. Therefore, the following description of the embodiments is made with reference to the DRAM as a non-limiting example.

In a DRAM integrated circuit device, memory cell arrays are typically arranged in rows and columns, such that a particular memory cell may be addressed by specifying a row and a column of an array of this memory cell. Correspondingly, the memory may select memory cells in the memory array by means of a row decoder and a column decoder, to perform a read operation, a verification operation or a programming operation on the selected memory cells. In addition, during the read operation, the verification operation or the programming operation, a control logic circuit in the memory may continuously accumulate row addresses of the memory cells to perform corresponding operations on predetermined blocks in the memory array.

Referring to FIG. 1, the memory array in the DRAM generally includes rows and columns, where a row direction corresponds to a plurality of word lines, for example, including eight word lines XC, XC+1, . . . , XC+7; and a column direction corresponds to a plurality of bit lines (BL), for example, includes eight bit lines BL0 to BL7. Each data pin DQ outputs a value of data of one burst length, and one burst length corresponds to 8-bit data, where the 8-bit data are respectively outputted by eight bit lines. Of course, one burst length may also correspond to 16-bit data or 32-bit data. In the exemplary embodiments of the present disclosure, reference is made by taking an example in which one burst length corresponds to 8-bit data, but not limited thereto.

Figure 2:
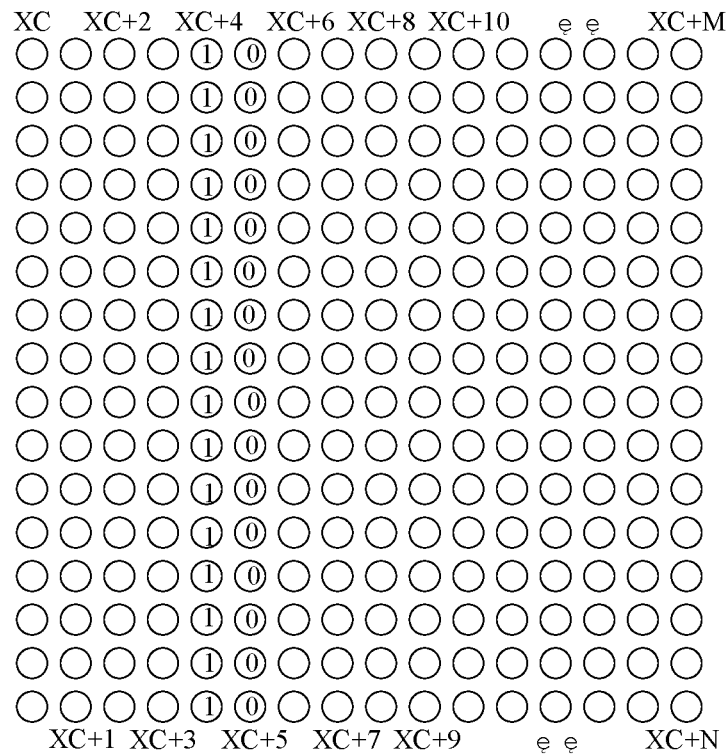
FIG. 2 schematically shows a schematic diagram I of a data structure of columns simultaneously turned on according to an exemplary embodiment of the present disclosure.
Figure 3:
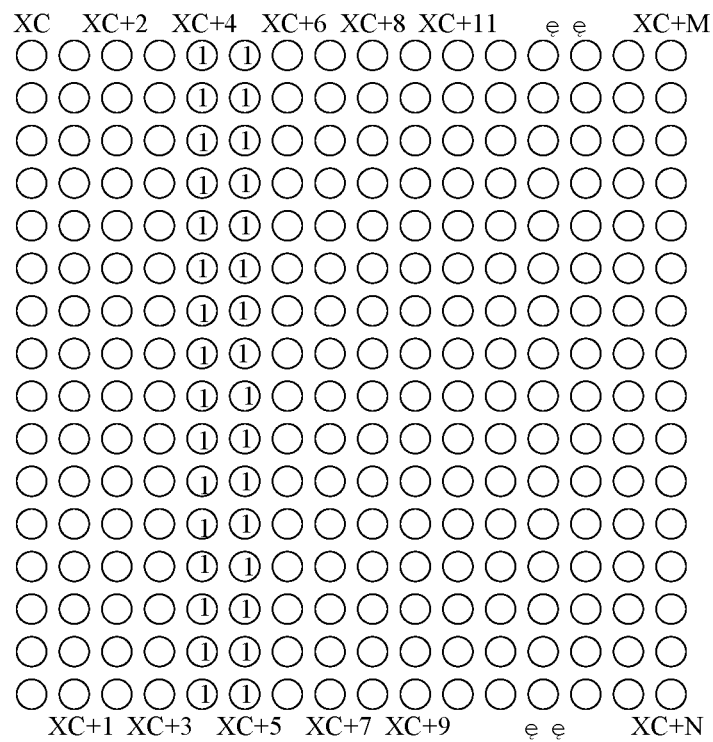
FIG. 3 schematically shows a schematic diagram II of a data structure of columns simultaneously turned on according to an exemplary embodiment of the present disclosure.
Figure 4:
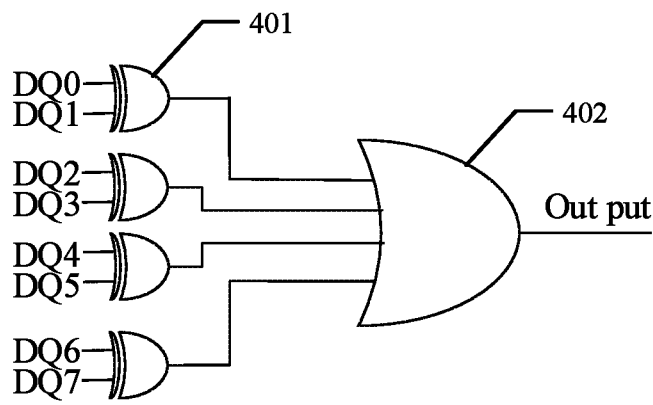
FIG. 4 schematically shows a schematic structural diagram I in an exclusive-OR mode according to an exemplary embodiment of the present disclosure.

For a memory array, in the case of an error in row decoding, two adjacent columns may likely be simultaneously turned on. For example, XC+4 and XC+5 in FIG. 2 are simultaneously turned on. In this case, data 1 stored in XC+4 may leak to XC+5, such that data 0 in XC+5 also change into 1, as shown in FIG. 3, leading to error of the data stored in the memory array. Moreover, this kind of error cannot be detected at all for the existing exclusive-OR mode as shown in FIG. 4 for detecting whether the row decoder is valid. In addition, a detection mode is not limited to the mode as shown in FIG. 4, data of DQ0 to DQ7 may be combined pairwise to perform exclusive-OR operation to obtain a plurality of operation results, and then OR operation is performed on the plurality of operation results to obtain the test result.

Based on this, the exemplary embodiments of the present disclosure provide a new method for testing a memory. This method is configured for detecting whether there are columns simultaneously turned on in the memory array, to quickly detect whether the row decoder fails.

Figure 5:
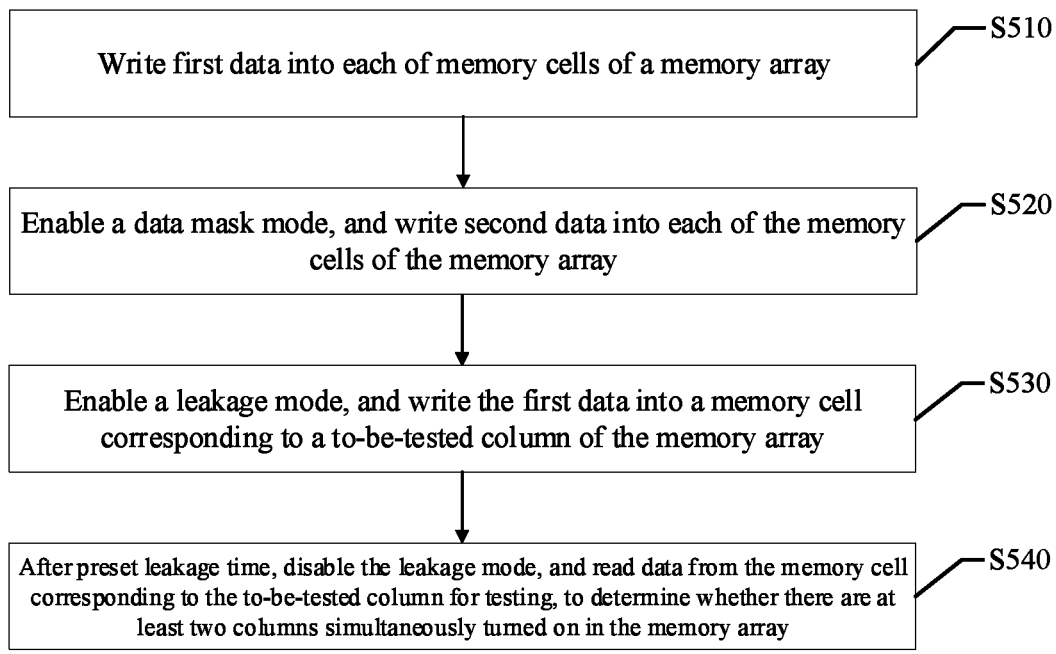
FIG. 5 schematically shows a flowchart of a method for testing a memory according to an exemplary embodiment of the present disclosure.

The method for testing a memory provided by the exemplary embodiments of the present disclosure, referring to FIG. 5, may include following steps:

Step S510: writing first data into each of memory cells of a memory array;

Step S520: enabling a data mask mode, and writing second data into each of the memory cells of the memory array;

Step S530: enabling a leakage mode, and writing the first data into a memory cell corresponding to a column under test of the memory array; and Step S540: after preset leakage time, disabling the leakage mode, and reading data from the memory cell corresponding to the column under test for testing, to determine whether there are at least two columns simultaneously turned on in the memory array.

In the method for testing a memory provided by the exemplary embodiments of the present disclosure, by enabling the data mask mode after writing the first data into each of the memory cells of the memory array, the first data in a predetermined memory cell may be latched. When the second data is subsequently written to each of the memory cells of the memory array, the second data is only written into other memory cells other than the predetermined memory cells. Next, in the leakage mode, when writing the first data into the memory cell corresponding to the column under test of the memory array, the first data cannot be written into the memory cell corresponding to the column under test of the memory array. When there are columns simultaneously turned on and word lines corresponding to the columns simultaneously turned on share the same bit line, after the preset leakage time, charges will flow into memory cells corresponding to the columns simultaneously turned on with the second data written. When the leakage mode is disabled, by reading data from the memory cell corresponding to the column under test for testing, it may be determined whether there are at least two columns simultaneously turned on in the memory array. In this way, the test of the row decoder in the memory may be completed, thereby achieving the objective of detecting whether the row decoder fails.

The method for testing a memory provided by the embodiments of the present disclosure are described below from different situations according to different column under tests.

Referring to FIG. 6, there is provided a memory array with eight rows and four columns. The above method for testing a memory is illustrated by taking an example where the column under test is a first column XC, a second column XC+1, a third column XC+2, and a fourth column XC+3 in sequence.

Embodiment I

When the column under test is the first column XC, supposing the first data is data 1, in Step S510, the first data is written into each of the memory cells of the memory array, as shown in FIG. 6, the data 1 is written into all the memory cells.

Next, in Step S520, the data mask mode is enabled.

In this exemplary embodiment of the present disclosure, the data mask mode is a mode in which data is locked, and in the data mask mode, mainly the first data is locked in a memory cell corresponding to a predetermined row.

In practical applications, the predetermined row may be set according to actual situations, and the predetermined row may be any row from a first row BL0 to an eighth row BL7.

In this exemplary embodiment of the present disclosure, a description is made by taking as an example where the predetermined row is the first row BL0. When the data 1 in the first row BL0 is locked, in Step S530, the second data (i.e., the data 0) is written into each of the memory cells of the memory array. In this case, situation as shown in FIG. 7 may occur. That is, only data in the predetermined row is still the data 1, and data in other rows is the data 0.

Next, in Step S530, the leakage mode is enabled, and the first data is written into the memory cell corresponding to the column under test of the memory array, where the column under test at this moment is the first column XC.

In this exemplary embodiment of the present disclosure, the leakage mode may be a floating-point test mode, i.e., a floating mode. In the floating mode, a signal source of the column under test is cut off, and voltage thereon approaches to 0, which is less than a word line turn-on voltage, thereby causing the first data not to be written into the column under test. In addition, the voltage is also greater than a word line turn-off voltage, resulting in electric leakage of the column under test. Therefore, when writing the first data, it is equivalent to a fact that the column under test enters the leakage mode.

Therefore, in the leakage mode, when writing the first data into the memory cell corresponding to the column under test of the memory array, the first data cannot be written into the memory cell corresponding to the column under test of the memory array. When there are columns simultaneously turned on and word lines corresponding to the columns simultaneously turned on share the same bit line, after the preset leakage time, charges will flow into memory cells corresponding to the columns simultaneously turned on with the second data written.

In practical applications, the preset leakage time may be set according to actual situations. For example, the preset leakage time may be the time from the activation command to the precharge command. No special restrictions are made on the preset leakage time in this exemplary embodiment of the present disclosure.

In this exemplary embodiment of the present disclosure, supposing the first column XC and the second column XC+1 are columns simultaneously turned on, after the preset leakage time, the first data ready to be written into the memory cell corresponding to the column under test, i.e., the data 1 ready to be written into the first column XC, will flow into the second column XC+1, such that the data in the second column XC+1 changes into the data 1, as shown in FIG. 8.

Figure 9:
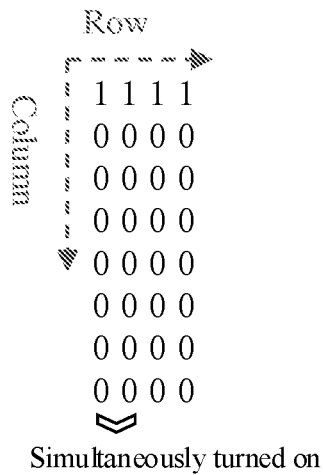

In the process of disabling the leakage mode and reading data from the memory cell corresponding to the column under test, because the first column XC and the second column XC+1 are still in the simultaneous turn-on state, the second data in the first column XC may enter into the second column XC+1 again, such that data of other rows except for data of the predetermined row locked change into the second data, i.e., the data 0, as shown in FIG. 9.

In this exemplary embodiment of the present disclosure, the data read from the memory cell corresponding to the column under test may be tested in different preset test modes, and the above-mentioned exclusive-OR mode is mainly taken as an example for illustration here.

In the exclusive-OR mode as shown in FIG. 4, a plurality of exclusive-OR gates 401 and one OR gate 402 are included, where each of the plurality of exclusive-OR gates 401 is configured to perform an exclusive-OR operation on two DQ data therein. Finally, an OR operation is performed on results obtained for all the exclusive-OR operations. When the results of all the exclusive-OR operations are the same, output of the OR gate 402 is 0, which represents that an exclusive-OR result is Pass, and in this case, the row decoder is valid. When the results of the exclusive-OR operations are different, the output of the OR gate 402 is 1, which represents that the exclusive-OR result is Fail, and in this case, the row decoder fails.

That is, the testing the data by means of a preset test mode to obtain the test result may include: inputting the data from the memory cell corresponding to the column under test into the preset test mode; in the preset test mode, performing an exclusive-OR operation on the data of the column under test pairwise to obtain a plurality of operation results; and performing an OR operation on the plurality of operation results to obtain the test result. When the test result is a high level, it is determined that there are at least two columns simultaneously turned on in the memory cell.

Figure 10:
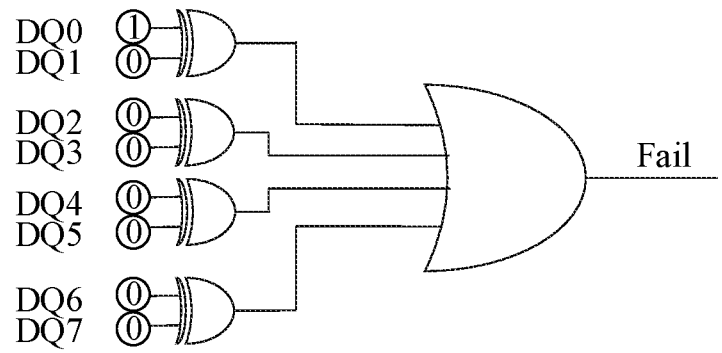
FIG. 10 schematically shows a schematic structural diagram II in an exclusive-OR mode according to an exemplary embodiment of the present disclosure.

When data of one burst length in the column under test is inputted as DQ data into the exclusive-OR mode, as can be seen from the data read from the column under test (the first column XC) as shown in FIG. 9, DQ0 may be obtained, by performing an operation, for the data of one burst length corresponding to the first column XC, and DQ1-DQ7 may be obtained, by performing operations, for the data of one burst length corresponding to other columns. As shown in FIG. 10, the DQ0 is at a high level 1, and the other DQ1-DQ7 are at a low level 0. After the exclusive-OR operation is completed, an output result obtained is 1, which represents that an exclusive-OR result is Fail. In this case, it may be determined that there are at least two columns simultaneously turned on in the memory array, and thus it may be determined that the row decoder of the memory is abnormal.

As can be seen from the above embodiment, when there are columns simultaneously turned on in the memory array of the memory, it may be detected whether the row decoder of the memory is abnormal by testing one of the columns simultaneously turned on.

It should be noted that the columns simultaneously turned on generally are adjacent columns, and there is a risk of electrical leakage between the adjacent columns.

Embodiment II

When the column under test is the second column XC+1, supposing the first data is data 1, in Step S510, the first data is written into each of the memory cells of the memory array, as shown in FIG. 6, the data 1 is written into all the memory cells.

Next, in Step S520, the data mask mode is enabled, and the first data in the memory cell corresponding to the predetermined row is locked by means of the data mask mode.

In practical applications, the predetermined row may be set according to actual situations, and the predetermined row may be any row from a first row BL0 to an eighth row BL7.

In this exemplary embodiment of the present disclosure, a description is made by taking as an example where the predetermined row is the first row BL0. When the data 1 in the first row BL0 is locked, in Step S530, the second data (i.e., the data 0) is written into each of the memory cells of the memory array. In this case, situation as shown in FIG. 7 may occur. That is, only data in the predetermined row is still the data 1, and data in other rows is the data 0.

Next, in Step S530, the leakage mode is enabled, and the first data is written into the memory cell corresponding to the column under test of the memory array, where the column under test at this moment is the second column XC+1.

In this exemplary embodiment of the present disclosure, the leakage mode may be a floating-point test mode, i.e., a floating mode. In the floating mode, a signal source of the column under test is cut off, and voltage thereon approaches to 0, which is less than a word line turn-on voltage, thereby causing the first data not to be written into the column under test. In addition, the voltage is also greater than a word line turn-off voltage, resulting in electric leakage of the column under test. Therefore, when writing the first data, it is equivalent to a fact that the column under test enters the leakage mode.

Therefore, in the leakage mode, when writing the first data into the memory cell corresponding to the column under test of the memory array, the first data cannot be written into the memory cell corresponding to the column under test of the memory array. When there are columns simultaneously turned on and word lines corresponding to the columns simultaneously turned on share the same bit line, after the preset leakage time, charges will flow into memory cells corresponding to the columns simultaneously turned on with the second data written. It should be noted that the floating mode is a mode for the column under test, that is, the leakage mode of the second column XC+1.

Therefore, when it is determine that there are columns simultaneously turned on after the preset leakage time in Step S540, in the leakage mode, the first data (i.e., the data 1) written into the column under test of the memory array may flow into the columns simultaneously turned on.

In practical applications, the preset leakage time may be set according to actual situations. For example, the preset leakage time may be the time from the activation command to the precharge command. No special restrictions are made on the preset leakage time in this exemplary embodiment of the present disclosure.

Figure 11:
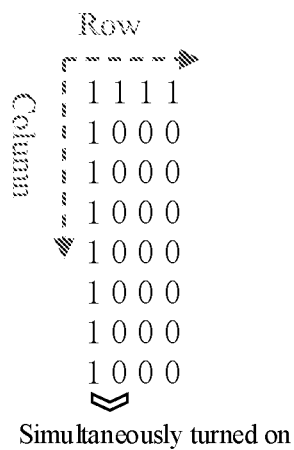
FIGS. 11 to 13 schematically show a schematic diagram II of a data distribution structure of a memory array according to an exemplary embodiment of the present disclosure.

In this exemplary embodiment of the present disclosure, supposing the first column XC and the second column XC+1 are columns simultaneously turned on, after the preset leakage time, the first data ready to be written into the memory cell corresponding to the column under test, i.e., the data 1 ready to be written into the second column XC+1, will flow into the first column XC, such that the data in the first column XC changes into the data 1, as shown in FIG. 11.

In the process of disabling the leakage mode and reading data from the memory cell corresponding to the column under test, because the first column XC and the second column XC+1 are still in the simultaneous turn-on state, the second data in the second column XC+1 may enter into the first column XC again, such that data of other rows except for data of the predetermined row locked change into the second data, i.e., the data 0, as shown in FIG. 9.

In this exemplary embodiment of the present disclosure, the data read from the memory cell corresponding to the column under test may be tested in different preset test modes, and the above-mentioned exclusive-OR mode is mainly taken as an example for illustration here.

In the exclusive-OR mode as shown in FIG. 4, a plurality of exclusive-OR gates 401 and one OR gate 402 are included.

A plurality of data of the column under test are correspondingly inputted into the plurality of exclusive-OR gates 401. After the exclusive-OR operation is performed one by one, and the OR operation is performed by means of the OR gate 402. When output of the OR gate 402 is 0, this represents that the exclusive-OR result is Pass, and in this case, the line decoder is valid. However, when the output of the OR gate 402 is 1, this represents the exclusive-OR result is Fail, and the line decoder is abnormal in this case.

That is, the testing the data by means of a preset test mode to obtain the test result may include: inputting the data from the memory cell corresponding to the column under test into the preset test mode; in the preset test mode, performing an exclusive-OR operation on the data of the column under test pairwise to obtain a plurality of operation results; and performing an OR operation on the plurality of operation results to obtain the test result. When the test result is a high level, it is determined that there are at least two columns simultaneously turned on in the memory cell.

When data of one burst length in the column under test is inputted as DQ data into the exclusive-OR mode, as can be seen from the data read from the column under test (the second column XC+1) as shown in FIG. 9, DQ0 may be obtained, by performing an operation, for the data of one burst length corresponding to the second column XC+1, and DQ1-DQ7 may be obtained, by performing operations, for the data of one burst length corresponding to other columns. As shown in FIG. 10, the DQ0 is at the high level 1, and the other DQ1-DQ7 are at the low level 0. After the exclusive-OR operation is completed, an output result obtained is 1, which represents that an exclusive-OR result is Fail. In this case, it may be determined that there are at least two columns simultaneously turned on in the memory array, and thus it may be determined that the row decoder of the memory is abnormal.

As can be seen from the above embodiment, when there are columns simultaneously turned on in the memory array of the memory, it may be detected whether the row decoder of the memory is abnormal by testing another one of the columns simultaneously turned on.

Embodiment III

When the column under test is the third column XC+2, there are no columns not simultaneously turned on in this case, supposing the first data is the data 1, in Step S510, the first data is written into each of the memory cells of the memory array, as shown in FIG. 6, the data 1 is written into all the memory cells.

Next, in Step S520, the data mask mode is enabled, and the first data in the memory cell corresponding to the predetermined row is locked by means of the data mask mode.

In practical applications, the predetermined row may be set according to actual situations, and the predetermined row may be any row from a first row BL0 to an eighth row BL7.

In this exemplary embodiment of the present disclosure, a description is made by taking as an example where the predetermined row is the first row BL0. When the data 1 in the first row BL0 is locked, in Step S530, the second data (i.e., the data 0) is written into each of the memory cells of the memory array. In this case, situation as shown in FIG. 7 may occur. That is, only data in the predetermined row is still the data 1, and data in other rows is the data 0.

Next, in Step S530, the leakage mode is enabled, and the first data is written into the memory cell corresponding to the column under test of the memory array, where the column under test at this moment is the third column XC+2.

In this exemplary embodiment of the present disclosure, the leakage mode may be a floating-point test mode, i.e., a floating mode. In the floating mode, a signal source of the column under test is cut off, and voltage thereon approaches to 0, which is less than a word line turn-on voltage, thereby causing the first data not to be written into the column under test. In addition, the voltage is also greater than a word line turn-off voltage, resulting in electric leakage of the column under test. Therefore, when writing the first data, it is equivalent to a fact that the column under test enters the leakage mode. Therefore, in the leakage mode, when writing the first data into the memory cell corresponding to the column under test of the memory array, the first data cannot be written into the memory cell corresponding to the column under test of the memory array. It should be noted that the floating mode is a mode for the column under test, that is, the leakage mode of the third column XC+2. There is no columns simultaneously turned on with the third column XC+2, so there is no leakage between adjacent columns.

In this exemplary embodiment of the present disclosure, in the leakage mode, the first data (i.e., the data 1) cannot be written into the third column XC+2, and charges in a memory cell corresponding to the third column XC+2 will gradually leak out, causing data stored in the third column XC+2 to change into the second data (i.e., the data 0). That is, the situation as shown in FIG. 12 occurs.

Figures 12, 13, 14:
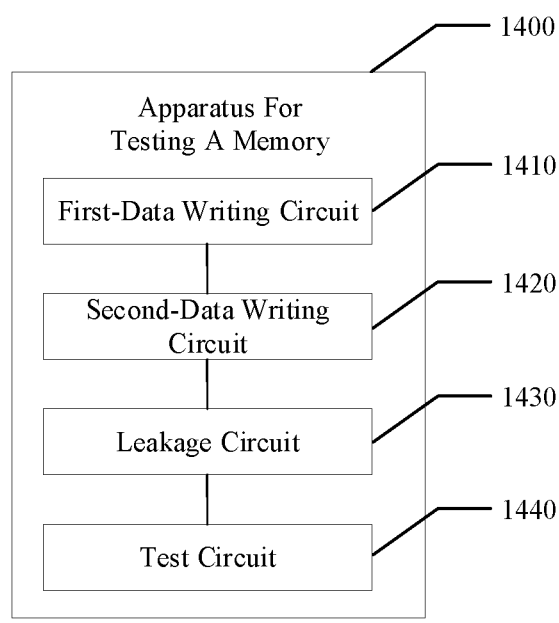
FIG. 14 schematically shows a block diagram of an apparatus for testing a memory according to an exemplary embodiment of the present disclosure.

In the process of disabling the leakage mode and reading the data from the memory cell corresponding to the column under test, the data in the third column XC+2 will not be affected by the columns simultaneously turned on, and all the data read from the third column XC+2 are the second data 0, still as shown in FIG. 12.

In this exemplary embodiment of the present disclosure, the data read from the memory cell corresponding to the column under test may be tested in different preset test modes, and the above-mentioned exclusive-OR mode is mainly taken as an example for illustration here.

In the exclusive-OR mode as shown in FIG. 4, a plurality of exclusive-OR gates 401 and one OR gate 402 are included.

A plurality of data of the column under test are correspondingly inputted into the plurality of exclusive-OR gates 401. After the exclusive-OR operation is performed one by one, and the OR operation is performed by means of the OR gate 402. When output of the OR gate 402 is 0, this represents that the exclusive-OR result is Pass, and in this case, the line decoder is valid. However, when the output of the OR gate 402 is 1, this represents the exclusive-OR result is Fail, and the line decoder is abnormal in this case.

When data of one burst length in the column under test is inputted, as DQ data obtained by performing an operation, into the exclusive-OR mode, as can be seen from the data read from the column under test (the third column XC+2) as shown in FIG. 12, DQ0 may be obtained, by performing an operation, for the data of one burst length corresponding to the third column XC+2, and DQ1-DQ7 may be obtained, by performing operations, for the data of one burst length corresponding to other columns, where DQ0-DQ7 are at the low level 0. After the exclusive-OR operation is completed, an output result obtained is 0, which represents that an exclusive-OR result is Pass. In this case, it may be determined that there are no columns simultaneously turned on with the column under test, but it is unable to determine whether there are other columns simultaneously turned on in the memory.

As can be seen from the above embodiment, when there are columns simultaneously turned on in the memory array of the memory but the column under test is not one of the columns simultaneously turned on, it is unable to detect whether the row decoder of the memory is abnormal.

Embodiment IV

On the basis of the Embodiment III, Step S530 is directly entered, in which the second data (the data 0) is written into each of the memory cells of the memory array. In this case, data distribution similar to as shown in FIG. 12 may occur.

Next, in Step S530, the leakage mode is enabled, and the first data is written into the memory cell corresponding to the column under test of the memory array, where the column under test at this moment is the fourth column XC+3.

In this exemplary embodiment of the present disclosure, the leakage mode may be a floating-point test mode, i.e., a floating mode. In the floating mode, a signal source of the column under test is cut off, and voltage thereon approaches to 0, which is less than a word line turn-on voltage, thereby causing the first data not to be written into the column under test. In addition, the voltage is also greater than a word line turn-off voltage, resulting in electric leakage of the column under test. Therefore, when writing the first data, it is equivalent to a fact that the column under test enters the leakage mode. Therefore, in the leakage mode, when writing the first data into the memory cell corresponding to the column under test of the memory array, the first data cannot be written into the memory cell corresponding to the column under test of the memory array. It should be noted that the floating mode is a mode for the column under test, that is, the leakage mode of the fourth column XC+3. There is no columns simultaneously turned on with the fourth column XC+3, so there is no leakage between adjacent columns.

In this exemplary embodiment of the present disclosure, in the leakage mode, the first data (i.e., the data 1) cannot be written into the fourth column XC+3, and charges in a memory cell corresponding to the fourth column XC+3 will gradually leak out, causing data stored in the fourth column XC+3 to change into the second data (i.e., the data 0). That is, the situation as shown in FIG. 13 occurs.

In the process of disabling the leakage mode and reading the data from the memory cell corresponding to the column under test, the data in the fourth column XC+3 will not be affected by the columns simultaneously turned on, and all the data read from the fourth column XC+3 are the second data 0, still as shown in FIG. 13.

In this exemplary embodiment of the present disclosure, the data read from the memory cell corresponding to the column under test may be tested in different preset test modes, and the above-mentioned exclusive-OR mode is mainly taken as an example for illustration here.

In the exclusive-OR mode as shown in FIG. 4, a plurality of exclusive-OR gates 401 and one OR gate 402 are included.

A plurality of data of the column under test are correspondingly inputted into the plurality of exclusive-OR gates 401. After the exclusive-OR operation is performed one by one, and the OR operation is performed by means of the OR gate 402. When output of the OR gate 402 is 0, this represents that the exclusive-OR result is Pass, and in this case, the line decoder is valid. However, when the output of the OR gate 402 is 1, this represents the exclusive-OR result is Fail, and the line decoder is abnormal in this case.

When data of one burst length in the column under test is inputted, as DQ data obtained by performing an operation, into the exclusive-OR mode, as can be seen from the data read from the column under test (the fourth column XC+3) as shown in FIG. 13, DQ0 may be obtained, by performing an operation, for the data of one burst length corresponding to the fourth column XC+3, and DQ1-DQ7 may be obtained, by performing operations, for the data of one burst length corresponding to other columns, where DQ0-DQ7 are at the low level 0. After the exclusive-OR operation is completed, an output result obtained is 0, which represents that an exclusive-OR result is Pass. In this case, it may be determined that there are no columns simultaneously turned on with the column under test, but it is unable to determine whether there are other columns simultaneously turned on in the memory.

As can be seen from the above embodiment, when there are columns simultaneously turned on in the memory array of the memory but the column under test is not one of the columns simultaneously turned on, it is unable to detect whether the row decoder of the memory is abnormal.

To sum up, the method for testing a memory provided by the exemplary embodiments of the present disclosure not only may be used for detecting whether there is an abnormality of the row decoder in the memory, but also may be used for improving effectiveness of the existing exclusive-OR mode on abnormality prediction.

It is to be noted that steps of the method in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

In addition, in this exemplary embodiment, an apparatus for testing a memory is also provided. Referring to FIG. 14, the apparatus 1400 for testing a memory may include: a first-data writing circuit 1410, a second-data writing circuit 1420, a leakage circuit 1430, and a test circuit 1440.

The first-data writing circuit 1410 may be configured to write first data into each of memory cells of a memory array.

The second-data writing circuit 1420 may be configured to enable a data mask mode, and write second data into each of the memory cells of the memory array.

The leakage circuit 1430 may be configured to enable a leakage mode, and write the first data into a memory cell corresponding to a column under test of the memory array.

The test circuit 1440 may be configured to disable, after preset leakage time, the leakage mode, and read data from the memory cell corresponding to the column under test for testing, to determine whether there are at least two columns simultaneously turned on in the memory array.

In an exemplary embodiment of the present disclosure, the test circuit 1440 may be configured to test the data read from the memory cell corresponding to the column under test by means of a preset test mode, to obtain a test result.

In an exemplary embodiment of the present disclosure, the preset test mode 1440 is an exclusive-OR mode.

In an exemplary embodiment of the present disclosure, the test circuit 1440 may be configured to: input the data from the memory cell corresponding to the column under test into the preset test mode; perform an exclusive-OR operation on the data of the column under test pairwise in the preset test mode to obtain a plurality of operation results; and perform an OR operation on the plurality of operation results to obtain the test result.

In an exemplary embodiment of the present disclosure, the test circuit 1440 may be configured to determine, when the test result is a high level, that there are at least two columns simultaneously turned on in the memory cell.

In an exemplary embodiment of the present disclosure, the test circuit 1440 may be configured to determine, when determining that there are at least two columns simultaneously turned on in the memory array, that a row decoder of the memory is abnormal.

In an exemplary embodiment of the present disclosure, the leakage mode 1430 is a floating-point test mode.

In an exemplary embodiment of the present disclosure, the first data is 1, and the second data is 0.

In an exemplary embodiment of the present disclosure, the preset leakage time is time from an activation command to a precharge command.

Concrete details of virtual circuits of the above-mentioned apparatus for testing a memory have been described in detail in the corresponding method for testing a memory, and thus are not to be repeated here.

It is to be noted that although a plurality of circuits or units of the apparatus for testing a memory have been mentioned in the above detailed description, this division is not mandatory. Actually, according to the embodiments of the present disclosure, features and functions of two or more circuits or units as described above may be embodied in one circuit or unit. Reversely, features and functions of one circuit or unit as described above may be further embodied in more circuits or units.

In an exemplary embodiment of the present disclosure, there is further provided an electronic device capable of implementing the above method.

As will be appreciated by one skilled in the art, aspects of the present disclosure may be embodied as a system, method or program product. Accordingly, aspects of the present disclosure may take the form of an entirely hardware embodiment, an entirely software embodiment (including firmware, micro-code, etc.) or an embodiment combining software and hardware aspects that may all generally be referred to herein as a "circuit," "circuit" or "system."

The electronic device 1500 according to this embodiment of the present disclosure is described below with reference to FIG. 15. The electronic device 1500 as shown in FIG. 15 is merely an example, and no limitation should be imposed on functions or scope of use of the embodiment of the present disclosure.

Figure 15:
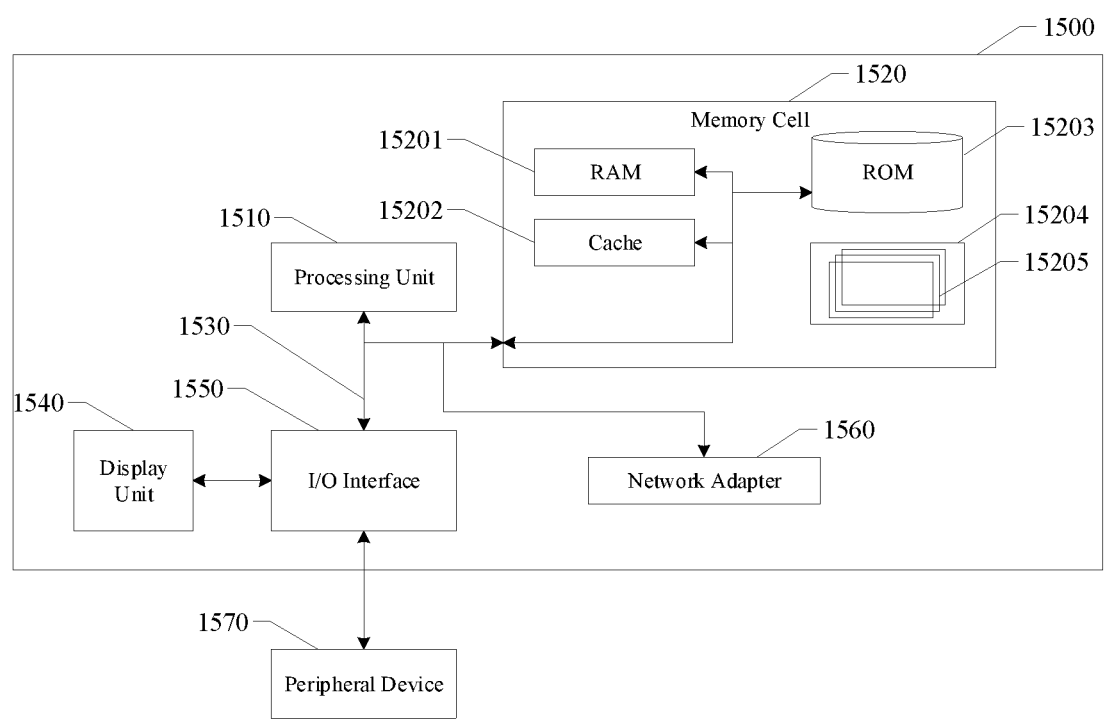
FIG. 15 schematically illustrates a schematic circuit diagram of an electronic device according to an exemplary embodiment of the present disclosure.

As shown in FIG. 15, the electronic device 1500 is shown in the form of a general-purpose computing device. Components of the electronic device 1500 may include, but are not limited to: at least one processing unit 1510, at least one memory cell 1520, a bus 1530 connecting different system components (including the memory cell 1520 and the processing unit 1510), and a display unit 1540.

The memory 1520 stores a program code, which may be executed by the processing unit 1510, such that the processing unit 1510 performs steps described in the "exemplary method" portions of this specification according to exemplary embodiments of the present disclosure. For example, the processing unit 1510 may perform steps as shown in FIG. 5, i.e., Step S510: writing first data into each of memory cells of a memory array; Step S520: enabling a data mask mode, and writing second data into each of the memory cells of the memory array; Step S530: enabling a leakage mode, and writing the first data into a memory cell corresponding to a column under test of the memory array; and Step S540: after preset leakage time, disabling the leakage mode, and reading data from the memory cell corresponding to the column under test for testing, to determine whether there are at least two columns simultaneously turned on in the memory array.

The memory 1520 may include readable media in the form of volatile memory, such as a random access memory (RAM) 15201 and/or a cache memory 15202. Furthermore, the memory 620 may further include a read-only memory (ROM) 15203.

The memory 1520 may include a program/utility tool 15204 having a group of (at least one) program circuits 15205. The program circuits 15205 include, but are not limited to: an operating system, one or more applications, other program circuits and program data. Each or a certain combination of these examples may include implementation of network environment.

The bus 1530 may represent one or more of a plurality of bus structures, including a memory bus or memory controller, a peripheral bus, an accelerated graphics port, a processing unit or a local bus using any bus structure among the plurality of bus structures.

The electronic device 1500 may communicate with one or more peripheral devices 1570 (such as keyboards, pointing devices, Bluetooth devices, etc.), and also may communicate with one or more devices allowing a user to interact with the electronic device 1500, and/or may communicate with any device (for example, a router, a modem and so on) allowing the electronic device 1500 to communicate with one or more other computing devices. This communication may be implemented by means of an input/output (I/O) interface 1550. Moreover, the electronic device 1500 also may communicate with one or more networks (for example, a local area network (LAN), a wide area network (WAN) and/or a public network such as the Internet) via a network adapter 1560. As shown in FIG. 6, the network adapter 1560 communicates with other circuits of the electronic device 1500 through the bus 1530. It should be understood that although not shown in the figures, other hardware and/or software circuits may be used in combination with the electronic device 1500, including but not limited to: microcode, device drivers, redundancy processing units, external disk drive arrays, redundant arrays of independent disks (RAID) systems, tape drives and data backup and storage systems, etc.

With description of the above embodiments, it will be readily understood by those skilled in the art that the exemplary embodiments described herein may be implemented by software or may be implemented by means of software in combination with the necessary hardware. Thus, the technical solution according to the embodiments of the present disclosure may be embodied in the form of a software product which may be stored in a nonvolatile storage medium (which may be CD-ROM, USB flash disk, mobile hard disk and the like) or on network, including a number of instructions for enabling a computing device (which may be a personal computer, a server, a terminal device, or a network device and the like) to perform the method according to the embodiments of the present disclosure.

In an exemplary embodiment of the present disclosure, there is further provided a computer readable storage medium storing a program product capable of implementing the above method in the specification. In some possible embodiments, aspects of the present disclosure may be implemented as a form of a program product, which includes a program code. When the program product runs on a terminal device, the program code is configured to enable the terminal device to perform the steps described in the above "exemplary method" portions of this specification according to the exemplary embodiments of the present disclosure.

The program product configured to implement the above method according to the embodiments of the present disclosure may adopt a portable compact disc read-only memory (CD-ROM) and include a program code, and may run on a terminal device such as a personal computer. However, the program product of the present disclosure is not limited thereto. In this document, a readable storage medium may be any tangible medium that can contain or store a program for use by or in connection with an instruction execution system, apparatus, or device.

Any combination of one or more readable medium(s) may be utilized by the program product. The readable medium may be a readable signal medium or a readable storage medium. The readable storage medium may be, for example, but not limited to, an electronic, magnetic, optical, electro-magnetic, infrared, or semiconductor system, apparatus, or device, or any suitable combination of the foregoing. More concrete examples (a non-exhaustive list) of the readable storage medium include the following: an electrical connection having one or more wires, a portable diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

A computer readable signal medium may include a propagated data signal with readable program code embodied therein, for example, in baseband or as part of a carrier wave. Such a propagated data signal may take any of a variety of forms, including, but not limited to, electro-magnetic, optical, or any suitable combination thereof. A readable signal medium may be any readable medium that is not a readable storage medium and that can communicate, propagate, or transport a program for use by or in connection with an instruction execution system, apparatus, or device.

Program code embodied on a readable medium may be transmitted using any appropriate medium, including but not limited to wireless, wireline, optical fiber cable, RF, etc., or any suitable combination of the foregoing.

Program code for carrying out operations of the present disclosure may be written in any combination of one or more programming languages, including an object-oriented programming language such as Java, C++ or the like and conventional procedural programming languages, such as the "C" programming language or similar programming languages. The program code may execute entirely on the user's computing device, partly on the user's computing device, as a stand-alone software package, partly on the user's computing device and partly on a remote computing device or entirely on the remote computing device or server. In a scenario involved with a remote computing device, the remote computing device may be coupled to the user's computing device through any type of network, including a local area network (LAN) or a wide area network (WAN), or may be coupled to an external computing device (for example, through the Internet using an Internet Service Provider).

Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of circuits.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A method for testing a memory, comprising:
   writing first data into each of memory cells of a memory array having a plurality of columns;
   enabling a data mask mode, and latching the first data into predetermined memory cells;
   writing second data only into other memory cells other than the predetermined memory cells;
   enabling a leakage mode, and writing the first data into a memory cell corresponding to a column under test of the plurality of columns;
   after preset leakage time, disabling the leakage mode, and reading data from the memory cell corresponding to the column under test for testing;
   reading data from the memory cells corresponding to columns of the plurality of columns; and
   determining whether at least two columns of the plurality of columns include first data
   wherein when determining that there are at least two columns simultaneously turned on
   in the memory array, a row decoder of the memory is determined abnormal.

2. The method for testing a memory according to claim 1, wherein the reading data from the memory cells corresponding to the column under test for testing comprises:
   testing the data read from the memory cells corresponding to the column under test by means of a preset test mode, to obtain a test result.

3. The method for testing a memory according to claim 2, wherein the preset test mode is an exclusive-OR mode.

4. The method for testing a memory according to claim 3, wherein the testing the data by means of a preset test mode to obtain the test result comprises:
   inputting the data from the memory cells corresponding to the column under test into the preset test mode;
   in the preset test mode, performing an exclusive-OR operation on the data of the column under test pairwise to obtain a plurality of operation results; and
   performing an OR operation on the plurality of operation results to obtain the test result.

5. The method for testing a memory according to claim 4, further comprising:
   when the test result is a high level, determining that there are at least two columns simultaneously turned on in the memory cells.

6. The method for testing a memory according to claim 1, wherein the leakage mode is a floating-point test mode.

7. The method for testing a memory according to claim 1, wherein the first data is 1, and the second data is 0.

8. The method for testing a memory according to claim 1, wherein the preset leakage time is time from an activation command to a precharge command.

9. An apparatus for testing a memory, comprising:
- a first-data writing circuit configured to write first data into each of memory cells of a memory array having a plurality of columns;
- a second-data writing circuit configured to enable a data mask mode and latching the first data into predetermined memory cells, and write second data only into other memory cells other than the predetermined memory cells;
- a leakage circuit configured to enable a leakage mode, and write the first data into a memory cell corresponding to a column under test of the plurality of columns; and
- a test circuit configured to disable, after preset leakage time, the leakage mode, and read data from the memory cell corresponding to the column under test for testing;
- read data from the memory cells corresponding to columns of the plurality of columns; and
- determining whether at least two columns of the plurality of columns include first data; wherein the test circuit is configured to determine, when determining that there are at least two columns simultaneously turned on in the memory array, that a row decoder of the memory is abnormal.

10. The apparatus for testing a memory according to claim 9, wherein the test circuit is configured to test the data read from the memory cells corresponding to the column under test by means of a preset test mode, to obtain a test result.

11. The apparatus for testing a memory according to claim 10, wherein the preset test mode is an exclusive-OR mode.

12. The apparatus for testing a memory according to claim 10, wherein the test circuit is configured to: input the data from the memory cells corresponding to the column under test into the preset test mode; perform an exclusive-OR operation on the data of the column under test pairwise in the preset test mode to obtain a plurality of operation results; and perform an OR operation on the plurality of operation results to obtain the test result.

13. The apparatus for testing a memory according to claim 12, wherein the test circuit is configured to determine, when the test result is a high level, that there are at least two columns simultaneously turned on in the memory cells.

14. The apparatus for testing a memory according to claim 9, wherein the leakage mode is a floating-point test mode.

15. The apparatus for testing a memory according to claim 9, wherein the first data is 1, and the second data is 0.

16. The apparatus for testing a memory according to claim 9, wherein the preset leakage time is time from an activate command to a precharge command.

17. A non-transitory computer-readable storage medium, for storing a computer program which, when executed by a processor causes the processor to perform the method according to claim 1.

18. An electronic device comprising:
- a processor; and
- a memory configured to store executable instructions of the processor;
- wherein the processor is configured to perform a method for testing a memory by executing the executable instructions, the method comprising:
- writing first data into each of memory cells of a memory array having a plurality of columns;
- enabling a data mask mode, and latching the first data into predetermined memory cells;
- writing second data only into other memory cells other than the predetermined memory cells ;
- enabling a leakage mode, and writing the first data into a memory cell corresponding to a column under test of the plurality of columns; and
- after preset leakage time, disabling the leakage mode, and reading data from the memory cell corresponding to the column under test for testing;
- reading data from the memory cells corresponding to columns of the plurality of columns; and
- determining whether at least two columns of the plurality of columns include first data.

* * * * *